United States Patent
Yokoyama et al.

(10) Patent No.: US 8,470,693 B2
(45) Date of Patent: Jun. 25, 2013

(54) METHOD FOR MANUFACTURING QUANTUM DOT

(75) Inventors: Shin Yokoyama, Higashihiroshima (JP); Yoshiteru Amemiya, Higashihiroshima (JP)

(73) Assignee: Hiroshima University, Higashihiroshima-shi, Hiroshima (JP)

(*) Notice: Subject to any disclaimer, the term of this patent is extended or adjusted under 35 U.S.C. 154(b) by 130 days.

(21) Appl. No.: 12/665,242

(22) PCT Filed: Mar. 31, 2008

(86) PCT No.: PCT/JP2008/000819
§ 371 (c)(1),
(2), (4) Date: Apr. 15, 2010

(87) PCT Pub. No.: WO2009/122458
PCT Pub. Date: Oct. 8, 2009

(65) Prior Publication Data
US 2010/0304553 A1 Dec. 2, 2010

(51) Int. Cl.
*H01L 21/36* (2006.01)
*H01L 21/20* (2006.01)
*H01L 21/469* (2006.01)

(52) U.S. Cl.
USPC ........... 438/478; 438/479; 438/765; 438/769; 438/778; 257/E21.267; 257/E21.269; 257/E21.274; 257/E21.278

(58) Field of Classification Search
USPC .............. 257/E21.267, E21.269, E21.274, 257/E21.278, E21.459
See application file for complete search history.

(56) References Cited

U.S. PATENT DOCUMENTS

| 6,060,743 | A | * | 5/2000 | Sugiyama et al. | 257/321 |
| 6,841,082 | B2 | | 1/2005 | Ha et al. | |
| 7,829,413 | B2 | * | 11/2010 | Kim | 438/263 |
| 2007/0066083 | A1 | * | 3/2007 | Yang et al. | 438/764 |
| 2007/0215856 | A1 | * | 9/2007 | Kwon et al. | 257/14 |

FOREIGN PATENT DOCUMENTS

| JP | 08-017577 | 1/1996 |
| JP | 09-102596 | 4/1997 |
| JP | 11-266055 | 9/1999 |
| JP | 2001-085545 | 3/2001 |
| JP | 2004-014711 | 1/2004 |
| JP | 2004-260044 | 9/2004 |
| JP | 2005-347465 | 12/2005 |
| JP | 2006-032564 | 2/2006 |

(Continued)

OTHER PUBLICATIONS

First Office Action in the corresponding Japanese Application No. 2009-525826 and Translation Thereof (for Concise Explanation); issued on Sep. 1, 2009.

(Continued)

*Primary Examiner* — Mohsen Ahmadi
(74) *Attorney, Agent, or Firm* — Foley & Lardner LLP

(57) ABSTRACT

A silicon oxide film (2) comprising an amorphous phase is deposited on a substrate (1) (see a step (b)) by a plasma CVD method using an $SiH_4$ gas and an $N_2O$ gas. Subsequently, a sample comprising the silicon oxide film (2)/the substrate (1) is set on an RTA apparatus. The sample (=the silicon oxide film (2)/the substrate (1)) is heat-treated (rapid heating and rapid cooling) (see a step (c)). In this case, a temperature raising rate is 200° C./s, and a temperature in heat treatment is 1000° C.

5 Claims, 13 Drawing Sheets

FOREIGN PATENT DOCUMENTS

| | | |
|---|---|---|
| JP | 2006-225258 | 8/2006 |
| JP | 2006-228732 | 8/2006 |
| JP | 2006-228916 | 8/2006 |
| JP | 2007-088311 | 4/2007 |
| JP | 2007-088436 | 4/2007 |

OTHER PUBLICATIONS

Second Office Action in the corresponding Japanese Application No. 2009-525826 and Translation Thereof (for Concise Explanation); issued on Nov. 24, 2009.

International Search Report for PCT/JP2008/000819, mailed May 27, 2008.

Amemiya, Y. et al., "Improvement of Luminescence Efficiency by Si-rich Nitride/Si-rich Oxide Multilayers," Extended Abstracts (The 55th Spring Meeting, 2008); *The Japan Society of Applied Physics and Related Societies*, No. 3, p. 1519, 29p-ZD-14 (with English translation, 3 pp).

Bedjaoui, M. et. al., "Si nanocrystal-containing $SiO_x$ (x<2) produced by thermal annealing of PECVD realized thin films," *Materials Science and Engineering B*, 2005, vol. 124-125, pp. 508-512.

Dao, L.V. et. al., "Time-resolved and time-integrated photoluminescence analysis of state filling and quantum confinement of silicon quantum dots," *J. Appl. Phys.*, 2005, vol. 97, 013501, 6 pp.

Iacona, F. et. al., "Formation and evolution of luminescent Si nanoclusters produced by thermal annealing of $SiO_x$ films," *J. Appl. Phys.*, 2004, vol. 95, No. 7, pp. 3723-3732.

Koukos, K. et. al., "Effect of Annealing Conditions on Photoluminescence Properties of Low-Pressure Chemical Vapour Deposition-Grown Silicon Nanocrystals," *Jpn. J. Appl. Phys.*, 2008, vol. 47, No. 1, pp. 130-132.

Nesbit, L.A., "Annealing characteristics of Si-rich $SiO_2$ films," *Appl. Phys. Lett.*, 1985, vol. 46, No. 1, p. 38-40.

Kim. D-W., et al., "Growth of Germanium Quantum Dots on Different Dielectric Substrates by Chemical-Vapor Deposition," J. Vac. Sci. Technol. B, vol. 19, Issue 4, pp. 1104-1108, Jul. 2001.

Tsybeskov, L., et al., "Nanocrystalline-Silicon Superlattice Produced by Controlled Recrystallization," IEEE, Applied Physics Letters, vol. 72, Issue 1, pp. 43-45, (1998).

Written Opinion of the International Searching Authority for Intl. Pat. Appln. No. PCT/JP2008/000819, dated May 27, 2008 (including full English translation), 13 pp.

\* cited by examiner (a)

(b)

HEAT TREATMENT BY RTA
(RAPID HEATING AND NATURAL COOLING)

(c)

(d)

(a)

(b)

(c)

(a)

(b)

(c)

METHOD FOR MANUFACTURING QUANTUM DOT

TECHNICAL FIELD

The present invention relates to a method for manufacturing quantum dots, and particularly relates to a method for manufacturing a quantum dot that can control a size and density of the quantum dots.

BACKGROUND ART

Conventionally, quantum dots made of silicon have been formed using an LPCVD (Low Pressure Chemical Vapor Deposition) technique (Japanese Patent Application Laid-Open No. 2006-32564).

In other words, the quantum dots are formed by using a silane ($SiH_4$) gas as a material gas, and performing a reaction for 50 to 70 seconds at a reaction pressure of 0.5 Torr and at a substrate temperature of 560° C. to 600° C.

DISCLOSURE OF THE INVENTION

When the quantum dots are produced using a conventional method for manufacturing a quantum dot, the size and density of the quantum dots can be controlled. When multi-layered quantum dots are produced, however, there is a problem that production time proportional to the number of layers is needed.

Then, the present invention has been made in order to solve the above-mentioned problem. An object of the present invention is to provide a method for manufacturing multi-layered quantum dots that can control a size and density thereof.

According to the present invention, a method manufacturing quantum dots includes: a first step of setting a quantitative ratio of a second material including a second element to a first material including a first element to a value of not less than a reference value, and depositing a thin film on a substrate; a second step of raising a temperature of the thin film deposited at the first step to a preset temperature at a temperature raising rate of not lower than a reference temperature raising rate; and a third step of heat-treating the thin film at the preset temperature. Moreover, the reference value is a quantitative ratio of the second material to the first material when an insulating film including the first and second elements is formed.

Preferably, at the first step, the thin film including an amorphous phase is deposited on the substrate.

Preferably, after the third step, the method manufacturing quantum dots further includes a fourth step of cooling the thin film at a temperature falling rate of not lower than a reference temperature falling rate.

Preferably, after the third step, the method manufacturing quantum dots further includes a fourth step of cooling the thin film at a temperature falling rate lower than the reference temperature falling rate.

Preferably, the first element is any of oxygen, nitrogen, and carbon, and the second element is any of Si, Ge, C, and Sn.

Preferably, the second element is any of silicon and germanium.

Preferably, a first reference value is a quantitative ratio of the second material to the first material when an insulating film including the first and second elements is formed, and a second reference value is a quantitative ratio of the second material to a third material including a third element when an insulating film including the third element and the second element is formed. Moreover, in the first step, the quantitative ratio of the second material to the first material is set to a value of not less than the first reference value, and the quantitative ratio of the second material to the third material is set to a value of not less than the second reference value to deposit the thin film on a substrate.

Preferably, the first element is oxygen, the second element is any of silicon and germanium, and the third element is nitrogen.

Preferably, the temperature raising rate is in a range of 0.2° C./s to 500° C./s.

Preferably, the temperature falling rate is in a range of 5° C./s to 50° C./s.

In the method manufacturing quantum dots according to the present invention, the quantum dots are manufactured by forming a thin film including the second element in an amount of not less than the reference value when the insulating film including the first and second elements is formed, and heating the formed thin film at the temperature raising rate of not lower than the reference temperature raising rate. In this case, the size and density of the quantum dot change depending on the temperature raising rate and a time length of heat treatment.

Therefore, according to the present invention, the size and density of the quantum dot can be controlled.

BEST MODE FOR CARRYING OUT THE INVENTION

Figure 1:
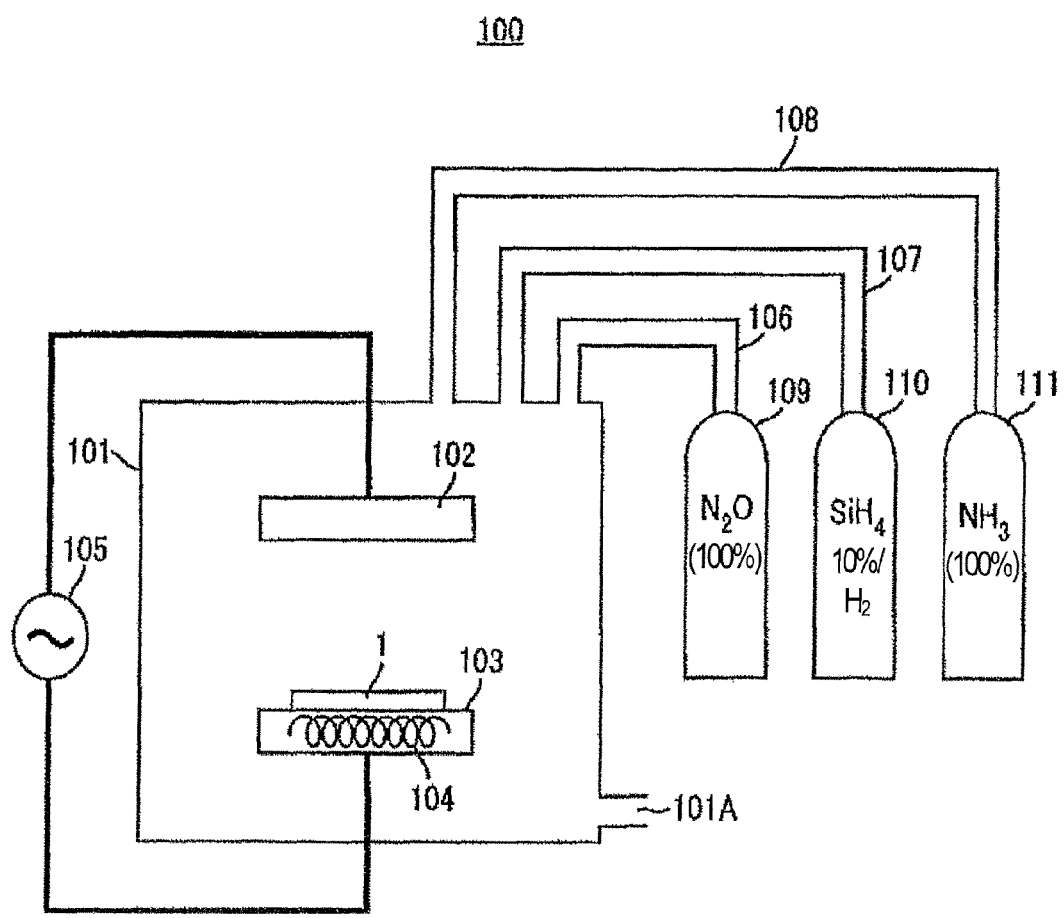
FIG. 1 is a schematic view of a plasma CVD (Chemical Vapor Deposition) apparatus.

An embodiment of the present invention will be described in detail with reference to the drawings. Same reference numerals will be given to same or equivalent portions in the drawings, and the description thereof will not be repeated.

FIG. 1 is a schematic view of a plasma CVD (Chemical Vapor Deposition) apparatus. With reference to FIG. 1, the plasma CVD apparatus 100 includes a reaction chamber 101, an electrode plate 102, a sample holder 103, a heater 104, an RF (Radio Frequency) power supply 105, piping elements 106 to 108, and gas cylinders 109 to 111.

The reaction chamber 101 is formed of a hollow container, and has an exhaust opening 101A. The electrode plate 102 and the sample holder 103 have a flat shape, and are disposed approximately parallel at an interval of 50 mm within the reaction chamber 101. Moreover, each of the electrode plate 102 and the sample holder 103 has a diameter of 200 mm$\phi$. The heater 104 is disposed within the sample holder 103.

The RF power supply 105 is connected to the electrode plate 102 and the sample holder 103. One end of the piping element 106 is connected to the reaction chamber 101, and the other end thereof is connected to the gas cylinder 109. Moreover, one end of the piping element 107 is connected to the reaction chamber 101, and the other end thereof is connected to the gas cylinder 110. Further, one end of the piping element 108 is connected to the reaction chamber 101, and the other end thereof is connected to the gas cylinder 111.

The sample holder 103 holds the substrate 1. The heater 104 heats the substrate 1 to a predetermined temperature. The RF power supply 105 applies RF power of 13.56 MHz between the electrode plate 102 and the sample holder 103.

The gas cylinder 109 holds an $N_2O$ (100%) gas, the gas cylinder 110 holds a 10% $SiH_4$ gas diluted by a hydrogen ($H_2$) gas, and the gas cylinder 111 holds an $NH_3$ (100%) gas.

The piping element 106 supplies the $N_2O$ gas into the reaction chamber 101. The piping element 107 supplies the $SiH_4$ gas into the reaction chamber 101. The piping element 108 supplies the $NH_3$ gas into the reaction chamber 101. The $N_2O$ gas, the $SiH_4$ gas, and the $NH_3$ gas supplied into the reaction chamber 101 are exhausted from the exhaust opening 101A by a exhaust apparatus (not shown) such as a rotary pump. As a result, an inside of the reaction chamber 101 is set at a predetermined pressure.

In the state where the $N_2O$ gas and the $SiH_4$ gas are supplied into the reaction chamber 101, the plasma CVD apparatus 100 applies the RF power between the electrode plate 102 and the sample holder 103 by the RF power supply 105. Thereby, a silicon oxide film is deposited on the substrate 1. Moreover, in the state where the $NH_3$ gas and the $SiH_4$ gas are supplied into the reaction chamber 101, the plasma CVD apparatus 100 applies the RF power between the electrode plate 102 and the sample holder 103 by the RF power supply 105. Thereby, a silicon nitride film is deposited on the substrate 1. Further, in a state where the $N_2O$ gas, the $NH_3$ gas, and the $SiH_4$ gas are supplied into the reaction chamber 101, the plasma CVD apparatus 100 applies the RF power between the electrode plate 102 and the sample holder 103 by the RF power supply 105. Thereby, a silicon oxynitride film is deposited on the substrate 1.

Figure 2:
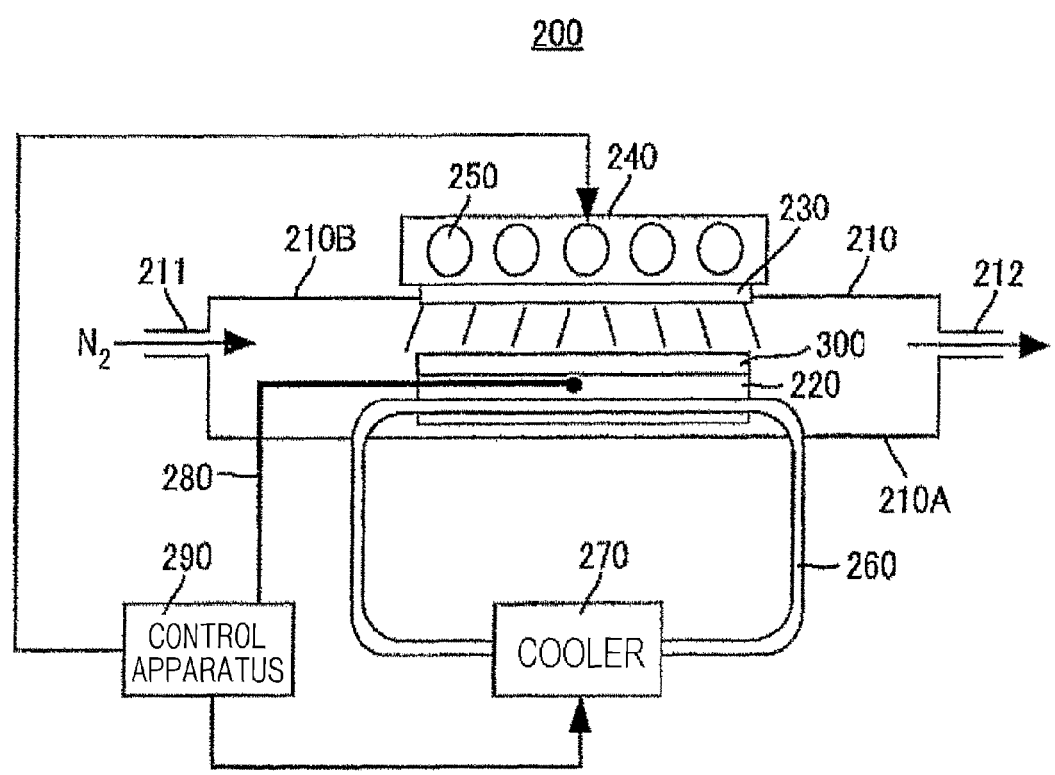
FIG. 2 is a schematic view of an RTA (Rapid Thermal Annealing) apparatus.

FIG. 2 is a schematic view of an RTA (Rapid Thermal Annealing) apparatus.

With reference to FIG. 2, the RTA apparatus 200 includes a container 210, a holder 220, a quartz window 230, a lamp house 240, a lamp 250, a piping element 260, a cooler 270, a thermocouple 280, and a control unit 290.

The container 210 has a gas inlet port 211 and a gas outlet port 212. The holder 220 is provided on the bottom surface 210A of the container 210. The quartz window 230 is provided on an upper surface 210B of the container 210, facing the holder 220.

The lamp house 240 is provided on an upper side of the quartz window 230. The lamp 250 is accommodated within the lamp house 230.

A part of the piping element 260 penetrates through the holder 220, and both ends of the piping element 260 are connected to the cooler 270. One end of the thermocouple 280 is embedded within the holder 220, and other end thereof is connected to the control apparatus 290.

The gas inlet port 211 feeds a nitrogen ($N_2$) gas, for example, from an outside into the container 210. The gas outlet port 212 exhausts the $N_2$ gas within the container 210 to the outside.

The holder 220 supports a sample 300. Light from the lamp 250 transmits through the quartz window 230. The lamp 250 heats the sample 300 through the quartz window 230. The piping element 260 circulates cooling water between the holder 220 and the cooler 270.

The cooler 270 feeds the cooling water to the piping element 260 in response to control from the control apparatus 290. The thermocouple 280 detects a temperature Ts of the sample 300, and outputs the detected temperature Ts to the control apparatus 290.

The control apparatus 290 receives the temperature Ts from the thermocouple 280. Then, when heating the sample 300, the control apparatus 290 supplies a power PW1 for raising the temperature Ts from room temperature to 1000° C. in 2 seconds to the lamp 250.

The control apparatus 290 also supplies a power PW2 for holding the temperature Ts at 1000° C. to the lamp 250.

Further, when rapidly decreasing the temperature Ts, the control apparatus 290 controls the cooler 270 so as to feed the cooling water.

When the sample 300 is heat-treated by RTA using the RTA apparatus 200, the sample 300 is set on the holder 220. Subsequently, the $N_2$ gas is fed into the container 210 from the gas inlet port 211 so that an inside of the container 210 is substituted with the $N_2$ gas.

After that, the control apparatus 290 supplies the power PW1 to the lamp 250. Then, when receiving the power PW1 from the control apparatus 290, the lamp 250 heats the sample 300 to raise the temperature Ts of the sample 300 from room temperature to 1000° C. in 2 seconds.

Then, the thermocouple 280 detects the temperature Ts of the sample 300, and outputs the detected temperature Ts to the control apparatus 290.

When receiving the temperature Ts from the thermocouple 280, the control apparatus 290 supplies the power PW2 for holding the temperature Ts at 1000° C. to the lamp 250 on the basis of the received temperature Ts. When receiving the power PW2 from the control apparatus 290, the lamp 250 holds the temperature Ts of the sample 300 at 1000° C.

Then, when a certain time passes, the control apparatus 290 outputs a signal OFF for turning off the lamp 250 to the lamp 250. The lamp 250 stops heating of the sample 300 in response to the signal OFF. Thereby, the sample 300 is cooled naturally.

On the other hand, when a certain time passes and the sample 300 is rapidly cooled, the control apparatus 290 generates a signal WON for feeding the cooling water, and outputs the signal WON to the cooler 270. Then, the cooler 270 feeds the cooling water into the piping element 260 in response to the signal WON from the control apparatus 290. Thereby, the sample 300 is cooled rapidly.

Figure 3:
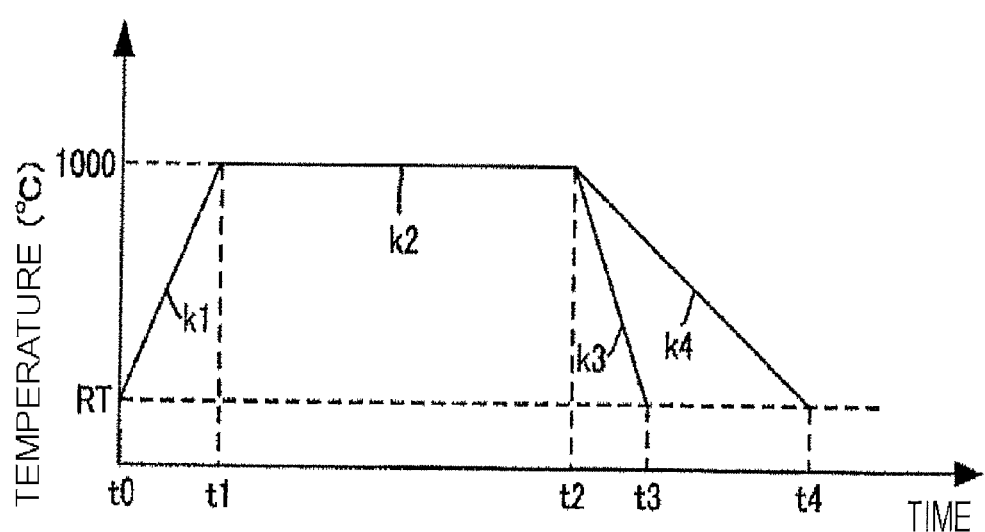
FIG. 3 is a timing chart of heat treatment by RTA using the RTA apparatus shown in FIG. 2.

FIG. 3 is a timing chart of heat treatment by RTA using the RTA apparatus 200 shown in FIG. 2.

In FIG. 3, an ordinate designates a temperature and an abscissa designates time. Moreover, straight lines k1, k2, and k3 express a first heat treatment method by RTA, and straight lines k1, k2, and k4 express a second heat treatment method by RTA.

With reference to FIG. 3, when the first heat treatment method is executed, the sample 300 is heated from a room temperature RT to 1000° C. in 5 seconds from a timing t0 to a timing t1 (see the straight line k1). Then, the sample 300 is held at 1000° C. for 1 minute from the timing t1 to a timing t2 (see the straight line k2).

Subsequently, the lamp 250 is turned off at the timing t2, and the cooling water is fed into the piping element 260. Then, the sample 300 is cooled from 1000° C. to the room temperature RT in 30 seconds from the timing t2 to a timing t3 (see the straight line k3).

On the other hand, when the second heat treatment method is executed, by the same method as the first heat treatment method, the sample 300 is heated from the room temperature RT to 1000° C., and is held at 1000° C. Then, the lamp 250 is turned off at the timing t2, and the sample 300 is cooled from 1000° C. to the room temperature RT in 30 minutes from the timing t2 to a timing t4 (see the straight line k4).

Thus, in the present invention, the sample 300 is heat-treated by rapid heating and rapid cooling, and the sample 300 is also heat-treated by rapid heating and natural cooling.

Figure 4:
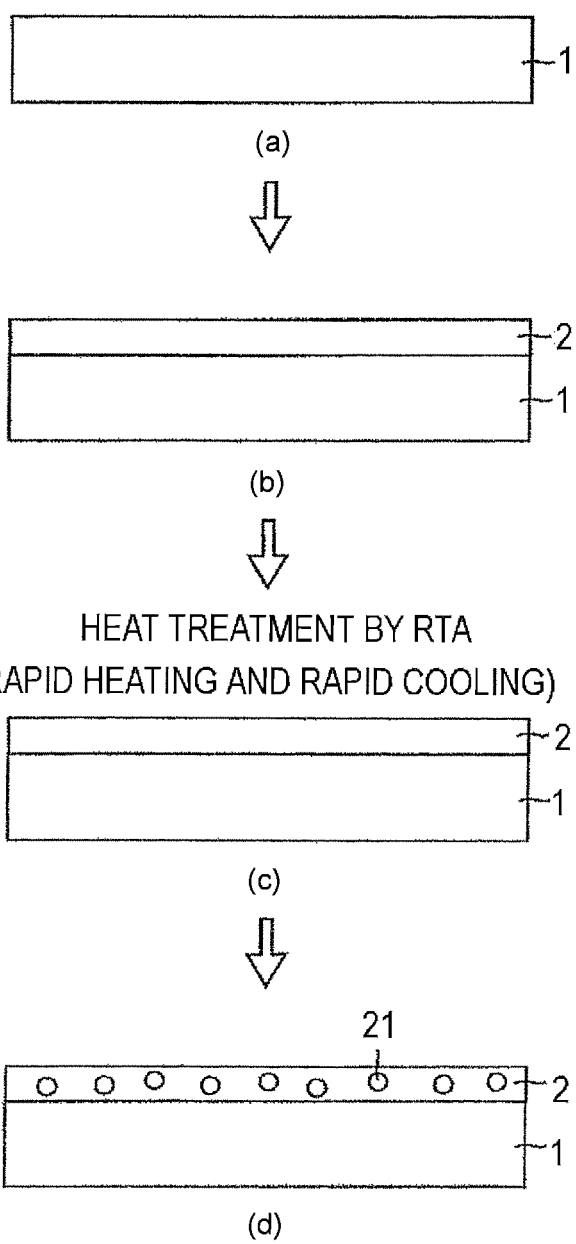
FIG. 4 is a process drawing when manufacturing quantum dots.

FIG. 4 is a process drawing when manufacturing quantum dots. When operation to manufacture quantum dots is started, a substrate 1 made of silicon (Si) is prepared (see a step (a) of FIG. 4). The substrate 1 is subjected to RCA washing, and subsequently provided on the sample holder 103 of the plasma CVD apparatus 100 shown in FIG. 1.

Then, the $N_2O$ gas is supplied into the reaction chamber 101 from the gas cylinder 109, and the $SiH_4$ gas is supplied into the reaction chamber 101 from the gas cylinder 110. A silicon oxide film 2 is deposited on the substrate 1 under the reaction condition shown in Table 1 (see a step (b) of FIG. 4). At this stage, the silicon oxide film 2 comprises an amorphous phase without including any crystal grain.

TABLE 1

| Flow rate of $SiH_4$ (10%, diluted by $H_2$) | 86 sccm |
|---|---|
| Flow rate of $N_2O$ (100%) | 34 sccm |
| Pressure | 133 Pa |
| RF power | 0.32 W/cm² |
| Substrate temperature | 300° C. |
| Reaction time | 3 minutes |

Subsequently, the sample 300 comprising the silicon oxide film 2/the substrate 1 is provided on the holder 220 of the RTA apparatus 200. Then, the sample 300 (=the silicon oxide film 2/the substrate 1) is heat-treated by RTA (rapid heating and rapid cooling) in accordance with the method mentioned above (see a step (c) of FIG. 4). As a result, quantum dots 21 are produced in the silicon oxide film 2.

Figure 5:
FIG. 5 is other process drawing when manufacturing quantum dots.
Figure 5:
Figure 5:
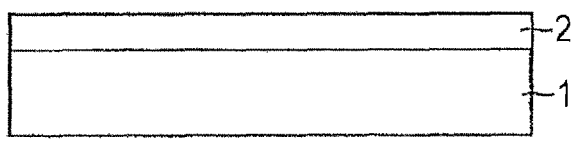
Figure 5:
Figure 5:
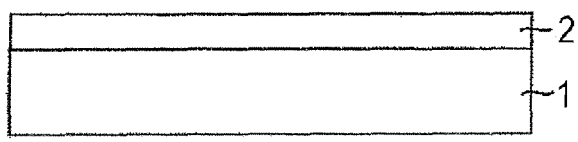
Figure 5:
Figure 5:
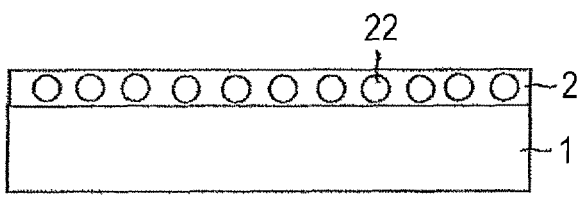

FIG. 5 is other process drawing when manufacturing quantum dots. When operation to manufacture quantum dots is started, the silicon oxide film 2 is deposited on the substrate 1 in accordance with the same steps as the steps (a) and (b) of FIG. 4 (see steps (a) and (b) of FIG. 5).

Subsequently, the sample 300 comprising the silicon oxide film 2/the substrate 1 is provided on the holder 220 of the RTA apparatus 200. Then, the sample 300 (=the silicon oxide film 2/the substrate 1) is heat-treated by RTA (rapid heating and natural cooling) in accordance with the method mentioned above (see a step (c) of FIG. 5). As a result, quantum dots 22 are produced in the silicon oxide film 2. The quantum dot 22 has a diameter larger than that of the quantum dot 21.

Figure 6:
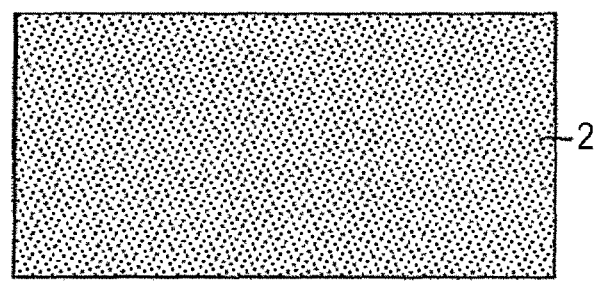
FIG. 6 is a conceptual diagram in a step (b) to a step (d) shown in FIG. 4.
Figure 6:
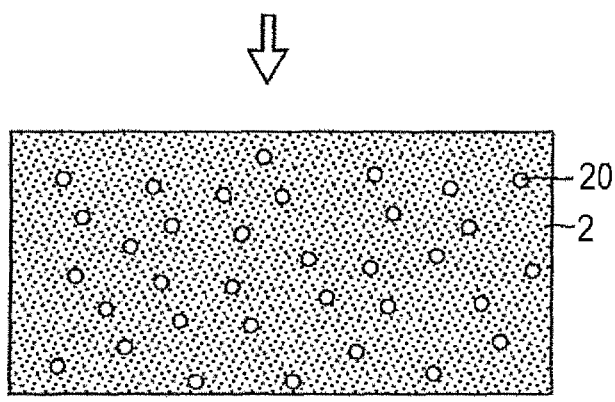
Figure 6:
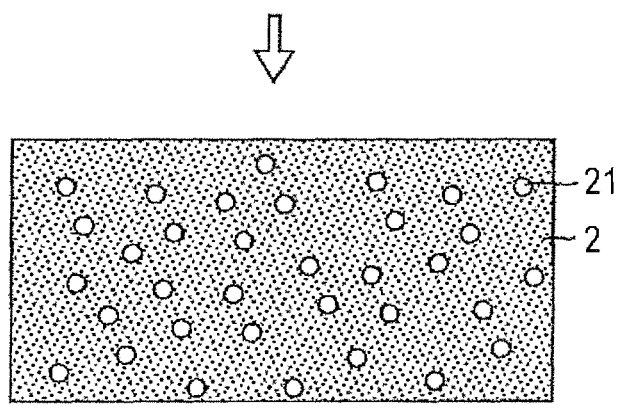

FIG. 6 is a conceptual diagram in the step (b) to the step (d) shown in FIG. 4. With reference to FIG. 6, the silicon oxide film 2 deposited at the step (b) shown in FIG. 4 comprises an amorphous phase (see (a) of FIG. 6). Then, in heat treatment by RTA, crystal grains 20 are produced at the stage where the sample 300 (=the silicon oxide film 2/the substrate 1) is heated to 1000° C. from the room temperature RT in 2 seconds (see (b) of FIG. 6).

Subsequently, when the sample 300 (=the silicon oxide film 2/the substrate 1) is held at 1000° C. and cooled rapidly, the crystal grains 20 grow so that the quantum dots 21 are produced (see (c) of FIG. 6).

Figure 7:
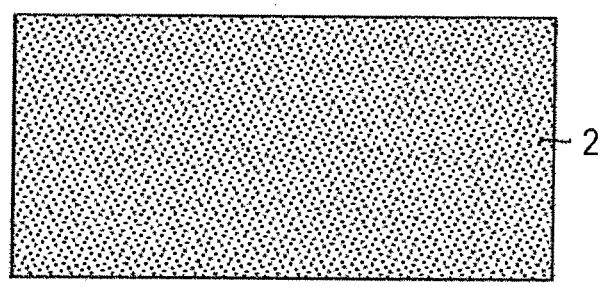
FIG. 7 is a conceptual diagram in a step (b) to a step (d) shown in FIG. 5.
Figure 7:
Figure 7:
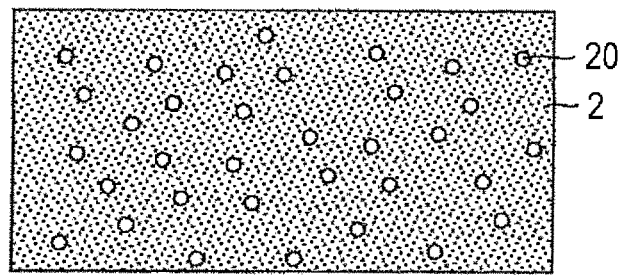
Figure 7:
Figure 7:
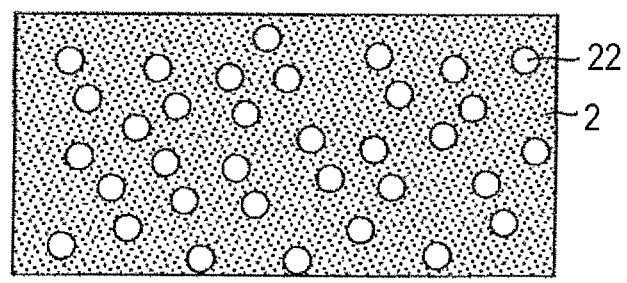

FIG. 7 is a conceptual diagram in the step (b) to the step (d) shown in FIG. 5. Similarly to the case shown in FIG. 6, the silicon oxide film 2 comprises an amorphous phase at the stage where the silicon oxide film 2 is deposited at the step (b) shown in FIG. 5 (see (a) of FIG. 7). Similarly to the case shown in FIG. 6, the crystal grains 20 are produced at the stage where the silicon oxide film 2 is heated from the room temperature RT to 1000° C. in 5 seconds (see (b) of FIG. 7).

Subsequently, when the sample 300 (=the silicon oxide film 2/the substrate 1) is held at 1000° C. and cooled naturally, the crystal grains 20 grow so that the quantum dots 22 are produced (see (c) of FIG. 7).

The quantum dot 22 has a size larger than that of the quantum dot 21, and has a density higher than that of the quantum dot 21.

As mentioned above, the size and density of the quantum dot can be controlled by controlling a cooling rate in heat treatment by RTA.

A flow rate ratio of the $SiH_4$ gas to the $N_2O$ gas on the condition (Table 1) to form the silicon nitride film 2 is larger than a flow rate ratio of the $SiH_4$ gas to the $N_2O$ gas when an $SiO_2$ film is formed as an insulating film (=reference flow rate ratio). In other words, in the present invention, the silicon oxide film 2 is formed using the flow rate of the $SiH_4$ gas larger than the reference flow rate, and is referred to as the so-called silicon rich oxide film.

Therefore, the present invention is characterized in that the quantum dot having a desired size and a desired density is manufactured by depositing the silicon rich oxide film 2 on the substrate 1 using the plasma CVD apparatus 100, and heat-treating the deposited silicon rich oxide film 2 by RTA.

While description has been made of the case where the quantum dots are manufactured by heat-treating the silicon oxide film by RTA in the above description, the present invention will not be limited to this. Alternatively, the quantum dots may be manufactured by heat-treating a silicon nitride film by RTA, or the quantum dots may be manufactured by heat-treating a silicon oxynitride film by RTA.

When the quantum dots are manufactured by heat-treating a silicon nitride film by RTA, the silicon nitride film is deposited on the substrate 1 under the reaction condition shown in Table 2, and the deposited silicon nitride film is heat-treated by RTA using the RTA apparatus 200.

TABLE 2

| Flow rate of $SiH_4$ (10%, diluted by $H_2$) | 92 sccm |
|---|---|
| Flow rate of $NH_3$ (100%) | 28 sccm |
| Pressure | 133 Pa |
| RF power | 0.32 W/cm² |
| Substrate temperature | 300° C. |
| Reaction time | 4 minutes |

In this case, the flow rate ratio of the $SiH_4$ gas to the $NH_3$ gas on the condition to form the silicon nitride film (Table 2) is larger than the flow rate ratio of the $SiH_4$ gas to the $NH_3$ gas when an $Si_3N_4$ film as an insulating film is formed (=reference flow rate ratio). In other words, in the present invention, the silicon nitride film is formed using the flow rate of the SiH$_4$ gas larger than the reference flow rate, and is referred to as the so-called silicon rich nitride film.

Therefore, the present invention is characterized in that the quantum dot having a desired size and a desired density is manufactured by depositing the silicon rich nitride film on the substrate 1 using the plasma CVD apparatus 100, and heat-treating the deposited silicon rich nitride film by RTA.

Further, when the quantum dots is manufactured by heat-treating a silicon oxynitride film by RTA, the silicon oxynitride film is deposited on the substrate 1 using reaction condition shown in Table 3, and the deposited silicon oxynitride film is heat-treated by RTA using the RTA apparatus 200.

| | |
|---|---|
| Flow rate of SiH$_4$ (10%, diluted by H$_2$) | 96 sccm |
| Flow rate of N$_2$O (100%) | 6 sccm |
| Flow rate of NH$_3$ (100%) | 18 sccm |
| Pressure | 133 Pa |
| RF power | 0.32 W/cm$^2$ |
| Substrate temperature | 300° C. |
| Reaction time | 4 minutes |

In this case, the flow rate ratio of the SiH$_4$ gas to the NH$_3$ gas on the condition to form the silicon oxynitride film (Table 3) is larger than the flow rate ratio of the SiH$_4$ gas to the NH$_3$ gas when an Si$_3$N$_4$ film as an insulating film is formed (=reference flow rate ratio), and the flow rate ratio of the SiH$_4$ gas to the N$_2$O gas is larger than the flow rate ratio of the SiH$_4$ gas to the N$_2$O gas when an SiO$_2$ film as an insulating film is formed (=reference flow rate ratio). In other words, in the present invention, the silicon oxynitride film is formed using the flow rate of the SiH$_4$ gas larger than the reference flow rate, and is referred to as the so-called silicon rich oxynitride film.

Therefore, the present invention is characterized in that the quantum dot having a desired size and a desired density is manufactured by depositing the silicon rich oxynitride film on the substrate 1 using the plasma CVD apparatus 100, and heat-treating the deposited silicon rich oxynitride film by RTA.

The film after heat-treating the silicon oxide film mentioned above comprises Si dots (semiconductor quantum dots) and SiO$_2$ (insulating film). The film after heat-treating the silicon nitride film comprises Si dots (semiconductor quantum dots) and Si$_3$N$_4$ (insulating film). The film after heat-treating the silicon oxynitride film comprises Si dots (semiconductor quantum dots) and SiO$_x$N$_{4/3-2x/3}$ (0<x<2) (insulating film).

Moreover, in the present invention, the semiconductor quantum dot will not be limited to a semiconductor quantum dot formed of Si dots. The semiconductor quantum dot may be made of Ge, C, or Sn, and the film around it may be made of any of SiO$_2$, SiO$_x$N$_{4/3-2x/3}$ (0<x<2), Si$_3$N$_4$, GeO$_2$, GeO$_x$N$_{4/3-2x/3}$ (0<X<2), and Ge$_3$N$_4$, which are an insulating film.

Then, the thin film before being subjected to heat treatment by RTA is produced by setting the quantitative ratio of a material (solid or gas) including an element forming an insulating film to a material (solid or gas) including an element forming the semiconductor quantum dot to a quantitative ratio of not less than the quantitative ratio (=reference value) when the insulating film is formed.

In this case, the thin film before being subjected to heat treatment by RTA is produced not only using the plasma CVD apparatus 100 mentioned above. The thin film is produced also using a variety of apparatuses such as MOCVD (Metal Organic Chemical Vapor Deposition) apparatuses, MBE (Molecular Beam Epitaxy) apparatuses, LPCVD apparatuses, and sputtering apparatuses.

Moreover, the temperature raising rate in heat treatment by RTA is 200° C./s in the above description, but will not be limited to this in the present invention. The temperature raising rate in heat treatment by RTA may be in the range of 0.2° C./s to 500° C./s, and generally may be not less than 0.2° C./s (=reference temperature raising rate).

Further, the temperature falling rate in heat treatment by RTA may be in the range of 5° C./s to 50° C./s in the case of rapid cooling, and generally may be not less than 5° C./s (=reference temperature falling rate).

Hereinafter, description will be given of an example where the quantum dots manufactured using the method for manufacturing quantum dots mentioned above are applied to a light emitting element.

Figure 8:
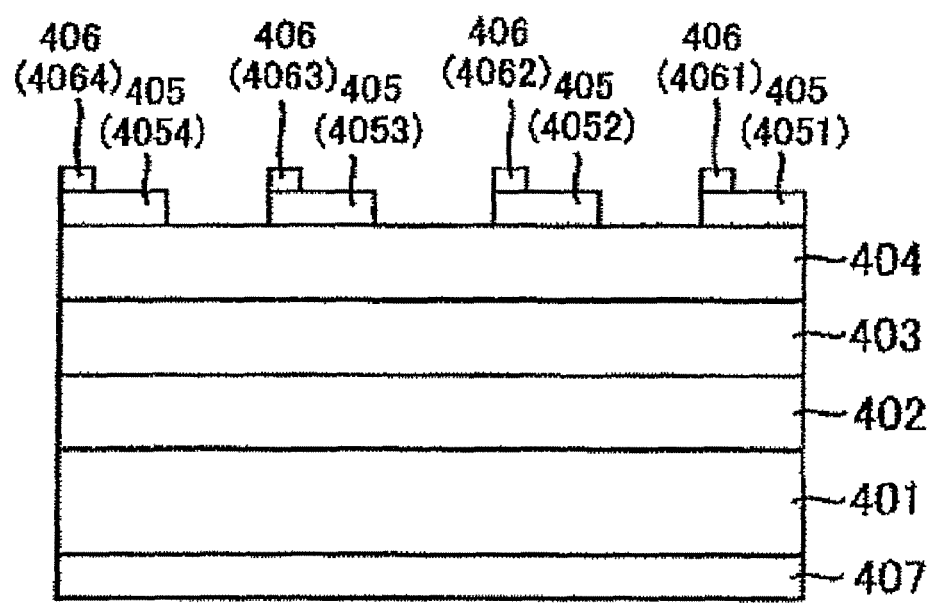
FIG. 8 is a sectional view of a light emitting element produced using a manufacturing method according to an embodiment of the present invention.

FIG. 8 is a sectional view of a light emitting element produced using a manufacturing method according to an embodiment of the present invention. With reference to FIG. 8, the light emitting element 400 includes a substrate 401, an n type silicon oxide film 402, an i type silicon nitride film 403, a p type silicon oxynitride film 404, a p$^+$ type polysilicon (poly-Si) film 405, and electrodes 406 and 407.

The substrate 401 is made of n$^+$ type silicon (n$^+$-Si) having a resistivity of approximately 0.1 Ω·cm. The n type silicon oxide film 402 includes a plurality of quantum dots made of n type Si as described later, and is formed on one main surface of the substrate 1. Moreover, the n type silicon oxide film 402 has a thickness of approximately 150 nm.

The i type silicon nitride film 403 includes a plurality of quantum dots made of i type Si as described later, and is formed on the n type silicon oxide film 402 in contact with the n type silicon oxide film 402. Moreover, the i type silicon nitride film 403 has a thickness of approximately 10 nm.

The p type silicon oxynitride film 404 is formed on the i type silicon nitride film 403 in contact with the i type silicon nitride film 403. The p type silicon oxynitride film 404 includes a plurality of quantum dots made of p type Si as described later, and has a composition of SiO$_1$N$_{0.33}$. Moreover, the p type silicon oxynitride film 404 has a thickness of approximately 100 nm.

The p$^+$ type poly-Si film 405 includes p$^+$ type poly-Si films 4051 to 4054, and is formed on the p type silicon oxynitride film 404 in contact with the p type silicon oxynitride film 404. Moreover, the p$^+$ type poly-Si film 405 has a boron concentration of approximately 10$^{20}$ cm$^{-3}$, and has a thickness of approximately 50 nm.

The electrode 406 includes electrodes 4061 to 4064. The electrodes 4061 to 4064 are formed on the p$^+$ type poly-Si films 4051 to 4054 in contact with the p$^+$ type poly-Si films 4051 to 4054, respectively. Each of the electrodes 4061 to 4064 is made of aluminum (Al).

The electrode 407 is made of Al, and is formed on the rear surface of the substrate 401 (surface opposite to the surface on which the n type silicon oxide film 402 and the like are formed).

Figure 9:
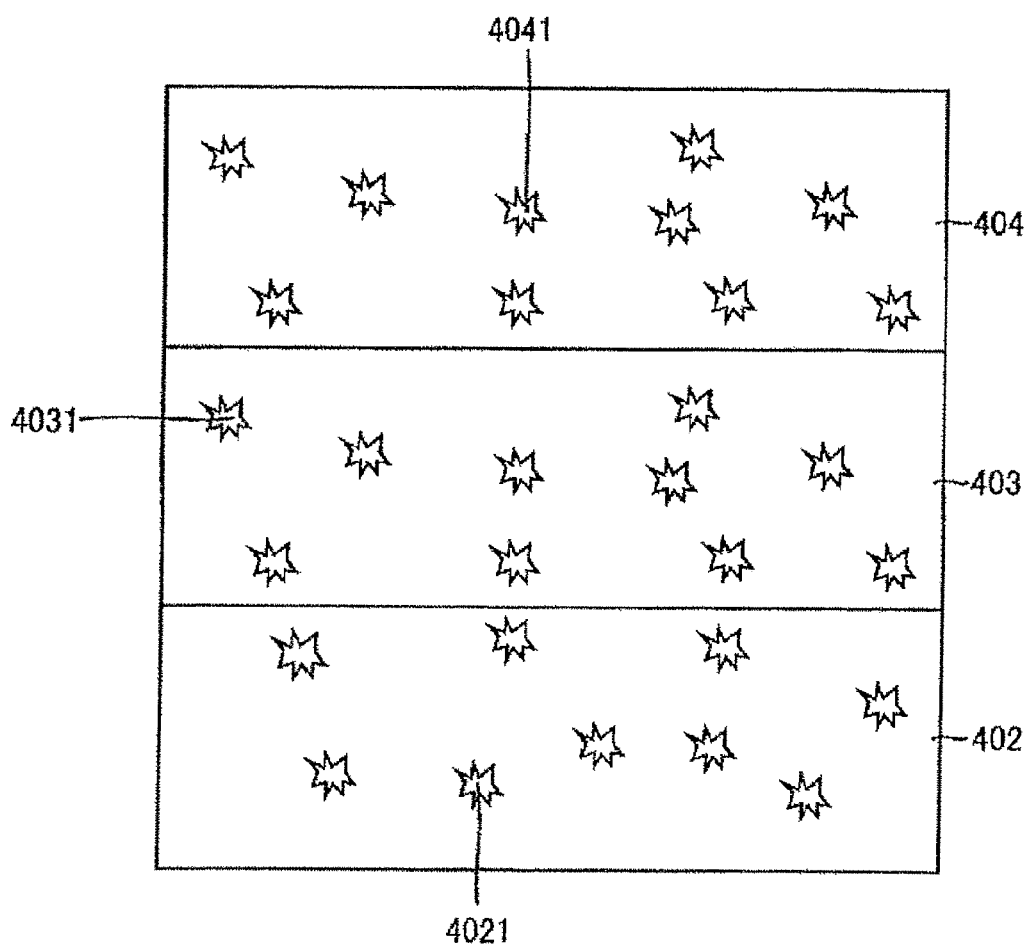
FIG. 9 is an enlarged sectional view of an n type silicon oxide film, an i type silicon nitride film, and a p type silicon oxynitride film shown in FIG. 8.

FIG. 9 is an enlarged sectional view of the n type silicon oxide film 402, the i type silicon nitride film 403, and the p type silicon oxynitride film 404 shown in FIG. 8. With reference to FIG. 9, the n type silicon oxide film 402 includes a plurality of quantum dots 4021. Each of the plurality of quantum dots 4021 is made of n type Si dots, and has a phosphorus (P) concentration of approximately 10$^{19}$ cm$^{-3}$. Moreover, the plurality of quantum dots 4021 are irregularly disposed in the n type silicon oxide film 402.

The i type silicon nitride film 403 includes a plurality of quantum dots 4031. Each of the plurality of quantum dots 4031 is made of i type Si dot. Moreover, the plurality of quantum dots 4031 are irregularly disposed in the i type silicon nitride film 403.

The p type silicon oxynitride film 404 includes a plurality of quantum dots 4041. Each of the plurality of quantum dots 4041 is made of p type Si dot, and has a B concentration of approximately $10^{19}$ cm$^{-3}$. Moreover, the plurality of quantum dots 4041 are irregularly disposed in the p type silicon oxynitride film 404.

Thus, the n type silicon oxide film 402 includes the quantum dots 4021 made of n type Si dots, the i type silicon nitride film 403 includes the quantum dots 4031 made of i type Si dots, and the p type silicon oxynitride film 404 includes the quantum dots 4041 formed of p type Si dots. Accordingly, the n type silicon oxide film 402, the i type silicon nitride film 403, and the p type silicon oxynitride film 404 form a pin junction.

Figure 10:
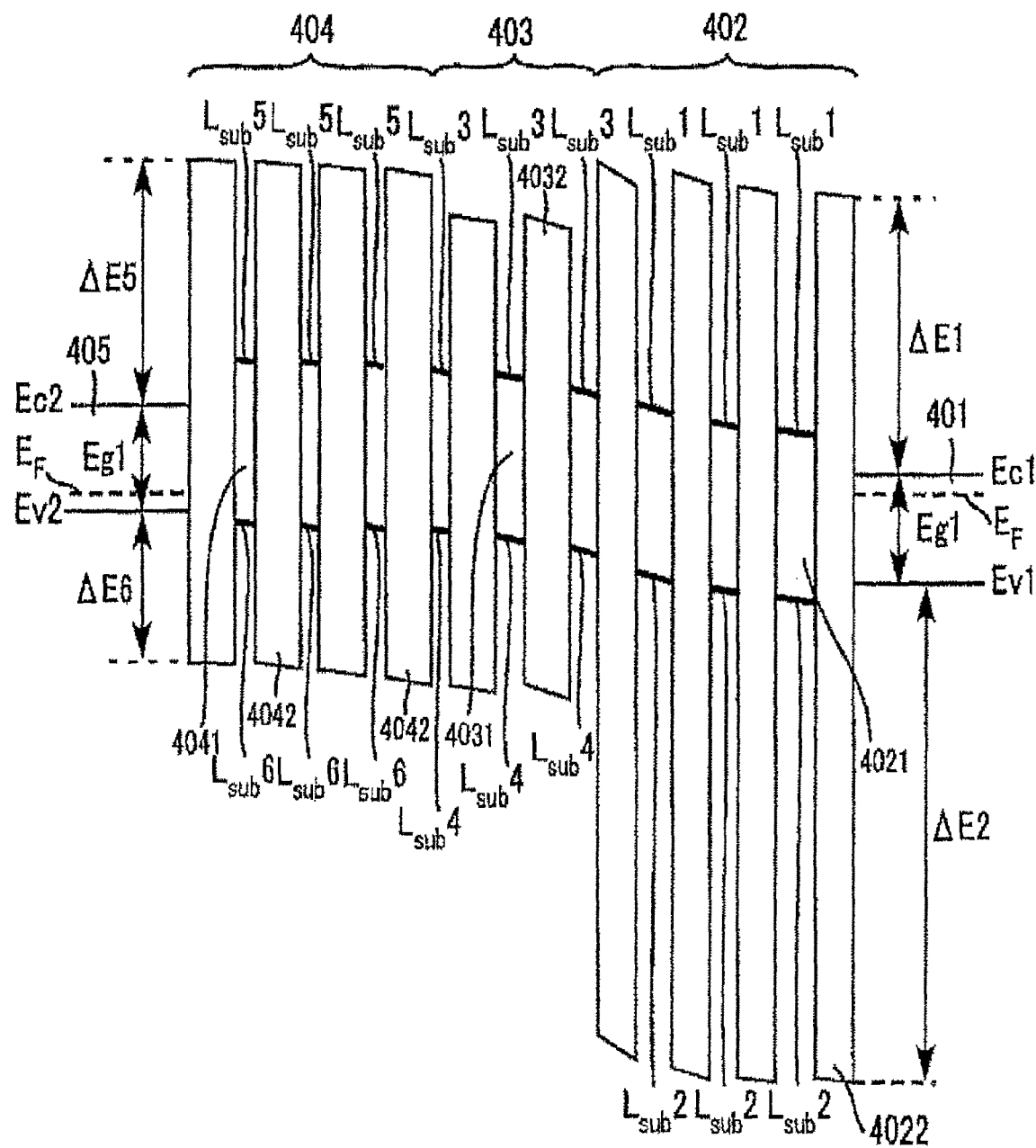
FIG. 10 is an energy band diagram when the light emitting element shown in FIG. 8 has zero bias.

FIG. 10 is an energy band diagram when the light emitting element 400 shown in FIG. 8 has zero bias. With reference to FIG. 10, a conduction band Ec1 and a valence band Ev1 exist in n$^+$ Si that forms the substrate 401. n$^+$ Si has an energy band gap Eg1 of 1.12 eV.

Moreover, a conduction band Ec2 and a valence band Ev2 exist in the p$^+$ poly-Si film 405. The p$^+$ poly-Si film 405 has the energy band gap Eg1 of 1.12 eV.

n$^+$ Si that forms the substrate 401 is heavily doped with P, and the p$^+$ poly-Si film 405 is heavily doped with B. Accordingly, an edge of the conduction band Ec1 of n$^+$ Si is close to an edge of the valence band Ev2 of the p$^+$ poly-Si film 404 with respect to energy.

The n type silicon oxide film 402 includes the plurality of quantum dots 4021 as mentioned above, and therefore has a laminated layer structure of the quantum dots 4021 and a silicon dioxide (SiO$_2$) layer 4022 including no quantum dot 4021. As a result, the quantum dots 4021 is sandwiched between the SiO$_2$ layers 4022.

The SiO$_2$ layer 4022 has an approximately an energy band gap of 9 eV. The quantum dots 4021 are sandwiched between two SiO$_2$ layers 4022. Accordingly, owing to a quantum size effect, the quantum dot 4021 has a sub-level $L_{sub}1$ on the conduction band Ec1 side of n$^+$ Si, and has a sub-level $L_{sub}2$ on the valence band Ev1 side of n$^+$ Si.

The sub-level $L_{sub}1$ has an energy higher than that of the conduction band Ec1 of n$^+$ Si, and the sub-level $L_{sub}2$ has an energy higher than that in the edge of the valence band Ev1 of n$^+$ Si. As a result, the energy difference between the sub-level $L_{sub}1$ and the sub-level $L_{sub}2$ is larger than the energy gap Eg1 of n$^+$ Si.

Moreover, an energy difference ΔE1 between the edge of the conduction band Ec1 of n$^+$ Si and the edge of the conduction band of the SiO$_2$ layer 4022 is approximately 3.23 eV. An energy difference ΔE2 between the edge of the valence band Ev1 of n$^+$ Si and the edge of the valence band of the SiO$_2$ layer 4022 is approximately 4.65 eV. Therefore, the n type silicon oxide film 402 has a barrier energy (=ΔE1) to an electron in n$^+$ Si smaller than a barrier energy (=ΔE2) to a hole in n$^+$ Si.

The i type silicon nitride film 403 includes the plurality of quantum dots 4031 as mentioned above, and therefore has a laminated layer structure of the quantum dots 4031 and a silicon nitride film (Si$_3$N$_4$) layer 4032 including no quantum dot 4031. As a result, the quantum dots 4031 are sandwiched between the Si$_3$N$_4$ layers 4032.

The Si$_3$N$_4$ layer 4032 has an energy band gap of an approximately 5.2 eV. Moreover, the quantum dots 4031 are sandwiched between two Si$_3$N$_4$ layers 4032. Accordingly, owing to the quantum size effect, the quantum dot 4031 has a sub-level $L_{sub}3$ on the conduction band Ec2 side of the p$^+$ poly-Si film 405, and has a sub-level $L_{sub}4$ on the valence band Ev4 side of the p$^+$ poly-Si film 405.

The sub-level $L_{sub}3$ has an energy higher than that in the edge of the conduction band Ec2 of the p$^+$ poly-Si film 405, and the sub-level $L_{sub}4$ has an energy higher than that in the edge of the valence band Ev2 of the p$^+$ poly-Si film 405. As a result, the energy difference between the sub-level $L_{sub}3$ and the sub-level $L_{sub}4$ is larger than the energy gap Eg1 of the p$^+$ poly-Si film 405.

The p type silicon oxynitride film 404 includes the plurality of quantum dots 4041 as mentioned above, and therefore, has a laminated layer structure of the quantum dots 4041 and a silicon oxynitride film layer 4042 including no quantum dot 4041. As a result, the quantum dots 4041 are sandwiched between the silicon oxynitride film layers 4042.

The silicon oxynitride film layer 4042 has an energy band gap of 7.1 eV. Moreover, the quantum dots 4041 are sandwiched between two silicon oxynitride film layers 4042. Accordingly, owing to the quantum size effect, the quantum dot 4041 has a sub-level $L_{sub}5$ on the conduction band Ec2 side of p$^+$ Si, and has a sub-level $L_{sub}6$ on the valence band Ev2 side of p$^+$ Si.

The sub-level $L_{sub}5$ has an energy higher than that of the conduction band Ec2 of p$^+$ Si, and the sub-level $L_{sub}6$ has an energy higher than that in the edge of the valence band Ev2 of p$^+$ Si. As a result, the energy difference between the sub-level $L_{sub}5$ and the sub-level $L_{sub}6$ is larger than the energy gap Eg1 of p$^+$ Si.

Moreover, an energy difference ΔE5 between the edge of the conduction band Ec2 of p$^+$ Si and the edge of the conduction band of the silicon oxynitride film layer 4042 is 4.2 eV. An energy difference ΔE6 between the edge of the valence band Ev2 of p$^+$ Si and the edge of the valence band of the silicon oxynitride film layer 4042 is approximately 1.78 eV. Therefore, the p type silicon oxynitride film 404 has a barrier energy (=ΔE6) to the hole in p$^+$ Si smaller than a barrier energy (=ΔE5) to the electron in p$^+$ Si.

Figure 11:
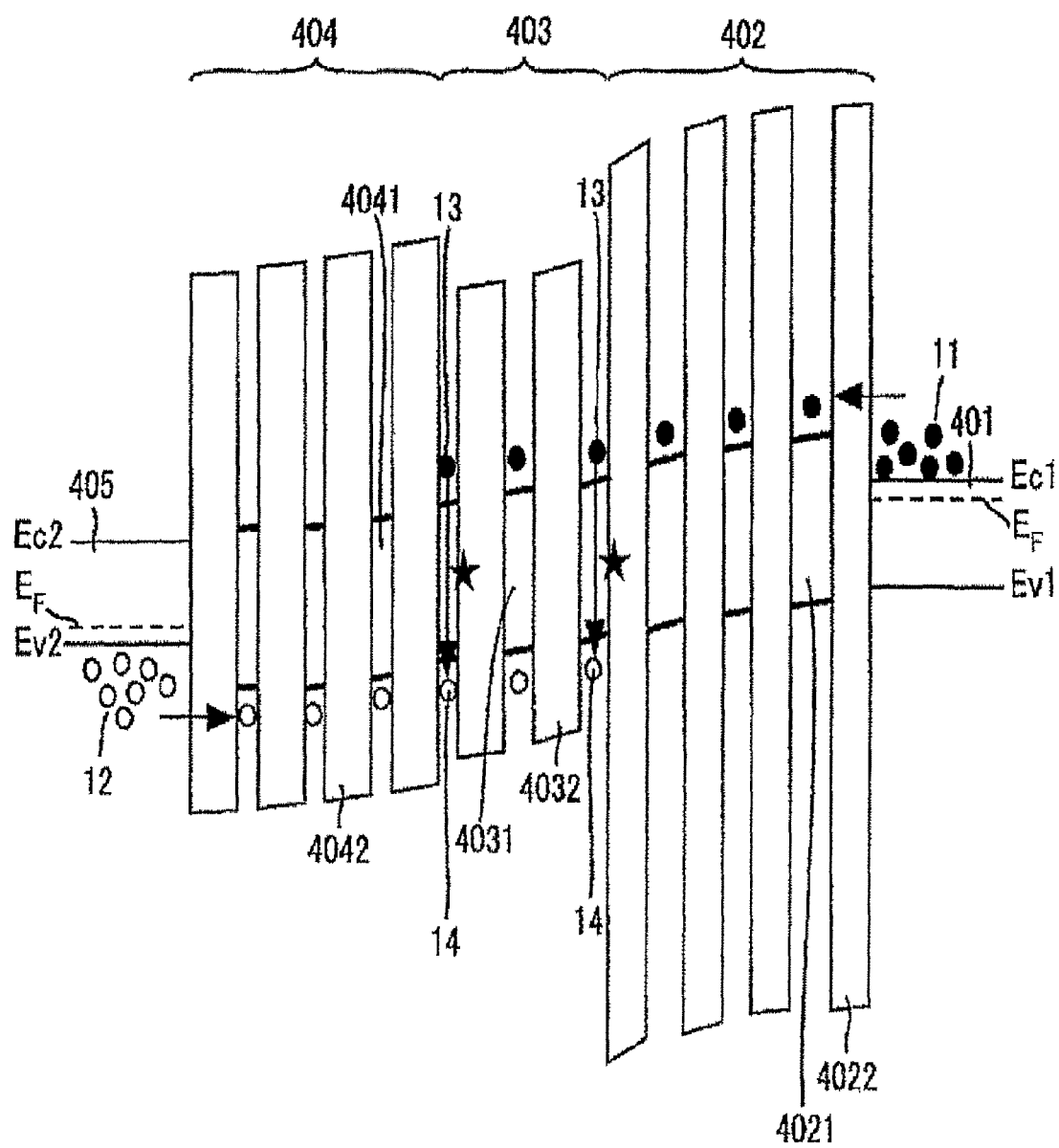
FIG. 11 is an energy band diagram when current flows through the light emitting element shown in FIG. 8.

FIG. 11 is an energy band diagram when current flows through the light emitting element 400 shown in FIG. 8. Voltage is applied between the electrodes 406 and 407 so that the electrode 406 is plus and the electrode 407 is minus. Then, as shown in FIG. 11, the energy band of n$^+$ Si that forms the substrate 401 is raised. The electron 11 in n$^+$ Si conducts in the n type silicon oxide film 402 through the plurality of quantum dots 4021 in the n type silicon oxide film 402, and is injected into the i type silicon nitride film 403.

The p type silicon oxynitride film 404 has a barrier to the electron larger than the i type silicon nitride film 403 has. Accordingly, the electron injected into the i type silicon nitride film 403 is blocked by the p type silicon oxynitride film 404, and is accumulated in the quantum dot 4031 of the i type silicon nitride film 403.

On the other hand, the hole 12 in the p$^+$ poly-Si film 405 conducts in the p type silicon oxynitride film 404 through the quantum dot 4041 in the p type silicon oxynitride film 404, and is injected into the i type silicon nitride film 403. The n type silicon oxide film 402 has a barrier to the hole larger than the i type silicon nitride film 403 has. Accordingly, the hole injected into the i type silicon nitride film 403 is blocked by the n type silicon oxide film 402, and is accumulated in the quantum dot 4031 of the i type silicon nitride film 403.

Then, the electron 13 accumulated in the quantum dot 4031 is recombined with the hole 14 accumulated in the quantum dot 4031 to emit light.

Thus, the light emitting element 400 is characterized in that the electrons injected from n$^+$ Si 401 into the i type silicon nitride film 403 are confined in the i type silicon nitride film 403 by the p type silicon oxynitride film 404, and the holes injected from the p⁺ poly-Si film 405 into the i type silicon nitride film 403 are confined in the i type silicon nitride film 403 by the n type silicon oxide film 402. In other words, the light emitting element 400 is characterized in that both the holes and the electrons are confined in the i type silicon nitride film 403. As a result, light emitting efficiency of the light emitting element 400 can be increased.

Moreover, the n type silicon oxide film 402 includes the plurality of quantum dots 4021 irregularly, the i type silicon nitride film 403 includes the plurality of quantum dots 4031 irregularly, and the p type silicon oxynitride film 404 includes the plurality of quantum dots 4041 irregularly. Accordingly, injection efficiency of the electron and that of the hole are improved because of an electric field enhancement effect of the quantum dots 4021, 4031, and 4041 disposed irregularly.

Therefore, according to the present invention, the light emitting efficiency can be increased.

Figure 12:
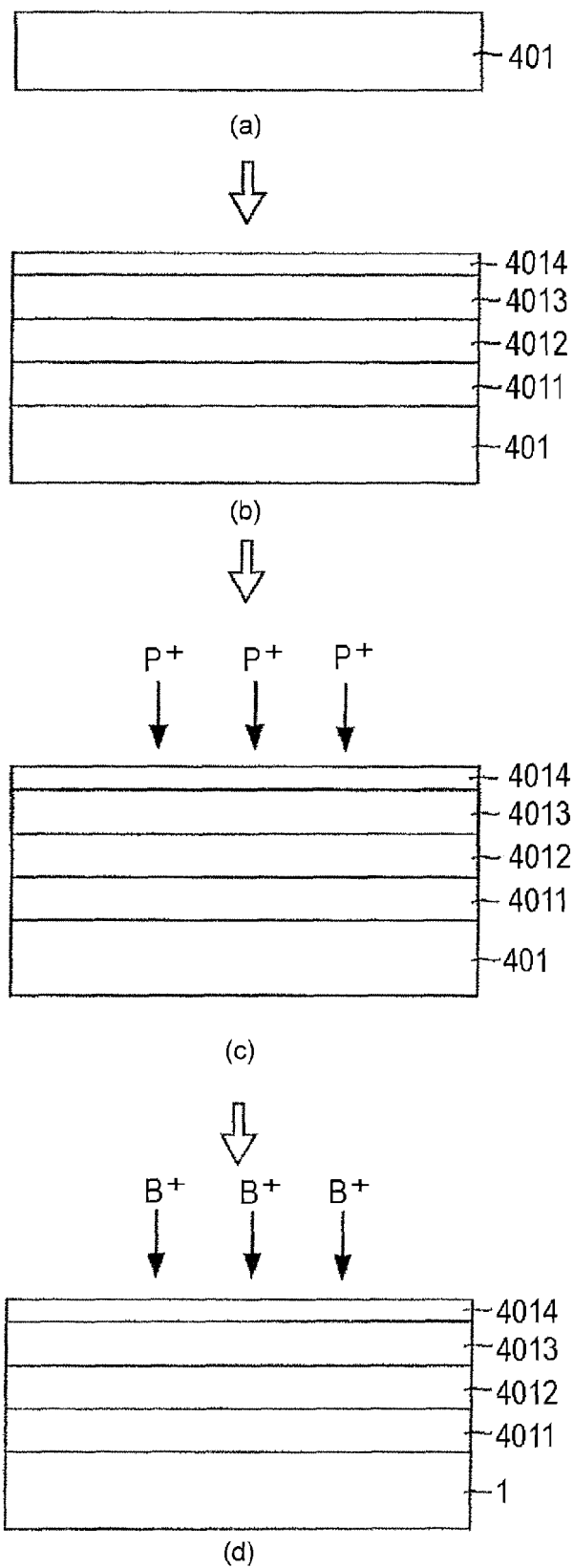
FIG. 12 is a first process drawing for describing a method for manufacturing the light emitting element shown in FIG. 8.
Figure 13:
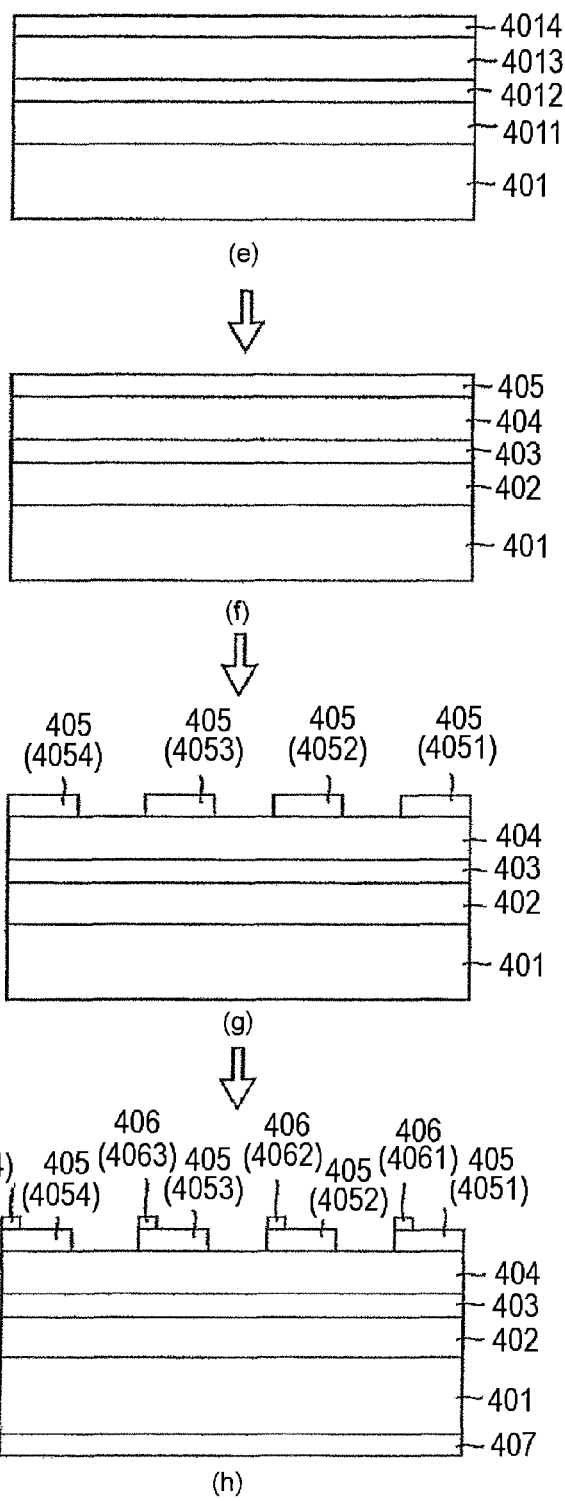
FIG. 13 is a second process drawing for describing a method for manufacturing the light emitting element shown in FIG. 8.

FIG. 12 and FIG. 13 are first and second process drawings for describing a method for manufacturing the light emitting element 400 shown in FIG. 8, respectively. With reference to FIG. 12, when manufacturing of the light emitting element 400 is started, the substrate 401 made of n⁺ Si is prepared (see a step (a)). The substrate 401 is washed, and subsequently set on the sample holder 103 of the plasma CVD apparatus 100.

Then, the silicon oxide film 4011 is deposited on one main surface of the substrate 1 under the reaction condition shown in Table 1. Subsequently, the silicon nitride film 4012 is deposited on the silicon oxide film 4011 under the reaction condition shown in Table 2. Further, subsequently, the silicon oxynitride film 4013 is deposited on the silicon nitride film 4012 under the reaction condition shown in Table 3.

Then, an amorphous silicon (a-Si) film 4014 is deposited on the silicon oxynitride film 4013 under the reaction condition in which the N₂O gas and the NH₃ gas are stopped in the reaction condition shown in Table 3 (see a step (b) of FIG. 12).

After that, phosphorus ions (P⁺) are injected into the silicon oxide film 4011 by ion implantation (see a step (c) of FIG. 12). In this case, an accelerating voltage for ion implantation is set so that the P⁺ ions may be injected only into the silicon oxide film 4011.

Then, boron ions (B⁺) are injected into the silicon nitride film 4012, the silicon oxynitride film 4013, and the a-Si film 4014 by ion implantation (see a step (d) of FIG. 12). In this case, the accelerating voltage for ion implantation is set so that the B⁺ ions may be injected into the silicon nitride film 4012, the silicon oxynitride film 4013, and the a-Si film 4014.

Then, after the step (d), in accordance with the method mentioned above, the substrate 1/the n type silicon oxide film 4011/the p type silicon nitride film 4012/the p type silicon oxynitride film 4013/the p type a-Si film 4014 is subjected to heat treatment by RTA (see a step (e) of FIG. 13).

Thereby, the n type silicon oxide film 402, the i type silicon nitride film 403, the p type silicon oxynitride film 404, and the p⁺ poly-Si film 405 are formed (see a step (f) of FIG. 13).

Subsequently, using a photolithographic technique, the p⁺ poly-Si film 405 is subjected to patterning so as to obtain the p⁺ poly-Si films 4051 to 4054 (see a step (g) of FIG. 13).

Then, by sputtering of Al, the electrode 406 (4061 to 4064) is formed on each of the p⁺ poly-Si films 4051 to 4054, respectively, and the electrode 407 is formed on the rear surface of the substrate 401 (see a step (h) of FIG. 13). Thereby, the light emitting element 400 is finished.

In all the points, the embodiments disclosed herein are merely an exemplification, and should not be considered to limit the present invention. The scope of the present invention is defined by the scope of claims, not by the description of the embodiments mentioned above. Furthermore, all the modifications within the scope of claims and within a sense equivalent to the scope of claims are included.

INDUSTRIAL APPLICABILITY

The present invention is applied to a method for manufacturing multi-layered quantum dots that can control a size and density thereof.

The invention claimed is:

1. A method of manufacturing a quantum dot, comprising:
setting a ratio of a second material to a first material to a value of not less than a first reference value, and depositing an amorphous thin film on a substrate;
raising a temperature of the amorphous thin film deposited at the setting a ratio to a preset temperature at a temperature raising rate of not lower than 0.2° C./second; and
heat-treating the amorphous thin film at the preset temperature to form a heat-treated amorphous thin film;
wherein:
the preset temperature is a temperature for generating a crystal grain;
the first material includes a first element;
the second material includes a second element;
the first reference value is a ratio of the second material to the first material when a stoichiometric insulating film including the first and second elements is formed;
a second reference value is a ratio of the second material to a third material including a third element when a stoichiometric insulating film including the third element and the second element is formed; and
at the setting a ratio, the ratio of the second material to the first material is set to a value of not less than the first reference value; and the ratio of the second material to the third material is set to a value of not less than the second reference value to deposit the amorphous thin film on the substrate;
the first element is oxygen;
the second element is any of silicon and germanium; and
the third element is nitrogen.

2. The method of manufacturing a quantum dot according to claim 1, further comprising cooling the heat-treated amorphous thin film at a temperature falling rate of not lower than 5° C./second.

3. The method of manufacturing a quantum dot according to claim 1, further comprising cooling the heat-treated amorphous thin film at a temperature falling rate lower than 5° C./second.

4. The method of manufacturing a quantum dot according to claim 1, wherein the temperature raising rate is in a range of 0.2° C./s to 500° C./s.

5. The method of manufacturing a quantum dot according to claim 1, wherein the temperature falling rate is in a range of 5° C./s to 50° C./s.

* * * * *

UNITED STATES PATENT AND TRADEMARK OFFICE
CERTIFICATE OF CORRECTION

PATENT NO. : 8,470,693 B2  
APPLICATION NO. : 12/665242  
DATED : June 25, 2013  
INVENTOR(S) : Yokoyama et al.

Page 1 of 1

It is certified that error appears in the above-identified patent and that said Letters Patent is hereby corrected as shown below:

In the Specification

In Column 3, Line 65, delete "house 230." and insert -- house 240. --, therefor.

In Column 7, Line 14, insert -- TABLE 3 --.

Signed and Sealed this  
Twenty-second Day of October, 2013

Teresa Stanek Rea  
*Deputy Director of the United States Patent and Trademark Office*